(12) United States Patent
Hirschler et al.

(10) Patent No.: US 10,453,806 B2
(45) Date of Patent: Oct. 22, 2019

(54) METHODS FOR FORMING SEMICONDUCTOR DEVICES AND SEMICONDUCTOR DEVICE

(71) Applicant: Infineon Technologies Austria AG, Villach (AT)

(72) Inventors: Joachim Hirschler, Villach (AT); Christoffer Erbert, St. Magdalen (AT); Markus Heinrici, Villach (AT); Mathias Plappert, Drobollach (AT); Caterina Travan, Villach (AT)

(73) Assignee: Infineon Teohnologies Austria AG, Villach (AT)

( * ) Notice: Subject to any disclaimer, the term of this patent is extended or adjusted under 35 U.S.C. 154(b) by 72 days.

(21) Appl. No.: 15/812,275

(22) Filed: Nov. 14, 2017

(65) Prior Publication Data
US 2018/0145038 A1 May 24, 2018

(30) Foreign Application Priority Data
Nov. 18, 2016 (DE) .................... 10 2016 122 251

(51) Int. Cl.
  *H01L 23/00* (2006.01)
  *H01L 21/56* (2006.01)
  (Continued)

(52) U.S. Cl.
  CPC ............ *H01L 23/564* (2013.01); *H01L 21/56* (2013.01); *H01L 21/565* (2013.01);
  (Continued)

(58) Field of Classification Search
  CPC .............................. H01L 21/56; H01L 23/296
  See application file for complete search history.

(56) References Cited
U.S. PATENT DOCUMENTS 5,391,913 A * 2/1995 Mino ..................... B82Y 10/00
                                                       257/432
6,206,997 B1 * 3/2001 Egitto ..................... B29C 59/14
                                                       156/242
(Continued)

FOREIGN PATENT DOCUMENTS

KR          2001036792 A  *  7/2001  ............. H01H 13/70

OTHER PUBLICATIONS

"Tailoring the Surface Properties of Silicone Elastomers to Improve Adhesion of Epoxy Topcoat", Jan Roth, et al, Journal of Adhesion Science and Technology 25 (2011) 1-26. Received in final form Apr. 15, 2010.
(Continued)

*Primary Examiner* — Caridad Everhart
*Assistant Examiner* — Ankush K Singal
(74) *Attorney, Agent, or Firm* — Dicke, Billig & Czaja, PLLC

(57) ABSTRACT

A method for forming a semiconductor device and semiconductor device is disclosed. In one example, the method includes forming a silicone layer on a semiconductor die. The method further includes plasma treating a silicone surface of the silicone layer. A surfactant is deposited on the plasma-treated silicone surface of the silicone layer to obtain a silicone surface at least partly covered by surfactant. A mold is formed on the silicone surface at least partly covered by surfactant. The surfactant includes surfactant molecules comprising an inorganic skeleton terminated by organic compounds.

17 Claims, 3 Drawing Sheets

(51) Int. Cl.
*H01L 23/29* (2006.01)
*H01L 23/31* (2006.01)

(52) U.S. Cl.
CPC ........ *H01L 23/296* (2013.01); *H01L 23/3135* (2013.01); *H01L 23/3142* (2013.01); *H01L 23/3171* (2013.01)

(56) References Cited

U.S. PATENT DOCUMENTS

| | | | |
|---|---|---|---|
| 2005/0074602 A1* | 4/2005 | Bjursten | A61L 27/306 428/334 |
| 2006/0246738 A1* | 11/2006 | Isobe | H01L 27/12 438/769 |
| 2006/0286809 A1* | 12/2006 | Becker | G03F 7/0757 438/748 |
| 2008/0180385 A1* | 7/2008 | Yoshida | G09G 3/20 345/102 |
| 2008/0297676 A1* | 12/2008 | Kimura | G02F 1/13624 349/39 |
| 2009/0039365 A1* | 2/2009 | Andrews | H01L 33/504 257/98 |
| 2010/0116526 A1* | 5/2010 | Arora | H01L 23/4985 174/254 |
| 2012/0219985 A1* | 8/2012 | Yoon | G01N 15/04 435/32 |
| 2015/0111335 A1* | 4/2015 | Granata | H01L 31/0392 438/73 |
| 2015/0262814 A1 | 9/2015 | Plappert et al. | |
| 2016/0220995 A1* | 8/2016 | Atashbar | B29C 65/4835 |

OTHER PUBLICATIONS

"One-step In-Mould Modification of PDMS Surfaces and its Application in the Fabrication of Self-Driven Microfluidic Channels", Ayodele Fatona, et al., The Royal Society of Chemistry 2015.

"Evaluation of Bonding Between Oxygen Plasma Treated Polydimethyl Siloxane and Passivated Silicon", KC Tang, et al., Journal of Physics: Conference Series 34 (2006) 155-161.

* cited by examiner

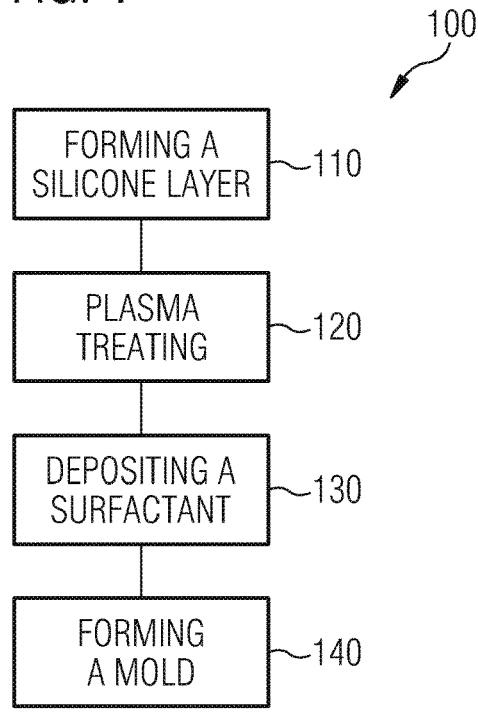
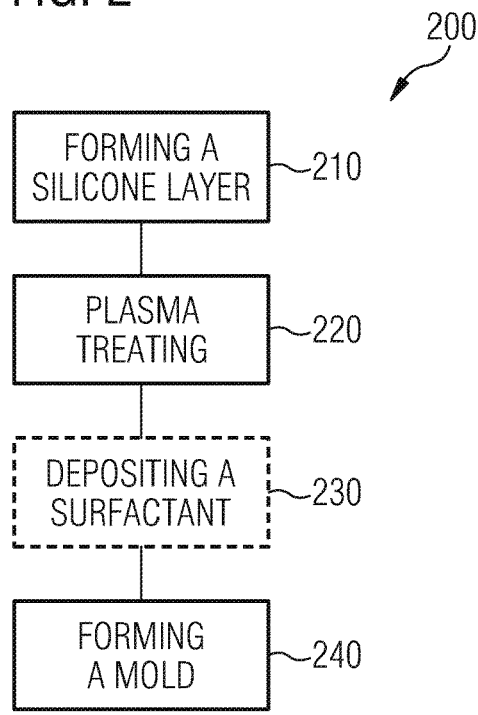

METHODS FOR FORMING SEMICONDUCTOR DEVICES AND SEMICONDUCTOR DEVICE

CROSS-REFERENCE TO RELATED APPLICATION

This Utility patent application claims priority to German Patent Application No. 10 2016 122 251.8, filed Nov. 18, 2016, which is incorporated herein by reference.

FIELD

Examples relate to concepts for protective measures for semiconductor devices and in particular to methods for forming semiconductor devices and to a semiconductor device.

BACKGROUND

Semiconductor devices, e.g. semiconductor devices that are used under challenging conditions such as in automotive applications, may require a protective layer to protect the semiconductor device from external influences such as humidity or dust. Some semiconductor devices may be protected by mold compounds, e.g. based on epoxy resin, that are formed on or around the semiconductor device.

SUMMARY

There may be a demand to provide an improved concept for forming semiconductor devices, which enables an improved protection of the semiconductor device from external influences and/or an increased life cycle and/or durability.

Such a demand may be satisfied by the subject matter of the claims.

Some embodiments relate to a method for forming a semiconductor device. The method comprises forming a silicone layer on a semiconductor die. The method further comprises plasma treating a silicone surface of the silicone layer. The method further comprises depositing a surfactant on the plasma-treated silicone surface of the silicone layer to obtain a silicone surface at least partly covered by surfactant. The method further comprises forming a mold on the silicone surface at least partly covered by surfactant. The surfactant comprises surfactant molecules comprising an inorganic skeleton terminated by organic compounds.

Some embodiments relate to a method for forming a semiconductor device. The method comprises forming a silicone layer on a semiconductor die. The method further comprises plasma treating a silicone surface of the silicone layer with an argon or argon/oxygen plasma. The method further comprises forming a mold above the plasma-treated silicone surface.

Some embodiments relate to a semiconductor device. The semiconductor device comprises a semiconductor die. The semiconductor device further comprises a silicone layer located on the semiconductor die. A silicone surface of the silicone layer is at least partially covered by surfactant. The semiconductor device further comprises a mold located adjacent to the silicone surface at least partially covered by surfactant.

BRIEF DESCRIPTION OF THE DRAWINGS

Some examples of apparatuses and/or methods will be described in the following by way of example only, and with reference to the accompanying figures, in which FIG. 1 is a flow chart illustrating a method for forming a semiconductor device;

FIG. 2 is a flow chart illustrating a method for forming a semiconductor device;

DETAILED DESCRIPTION

Figure 3:
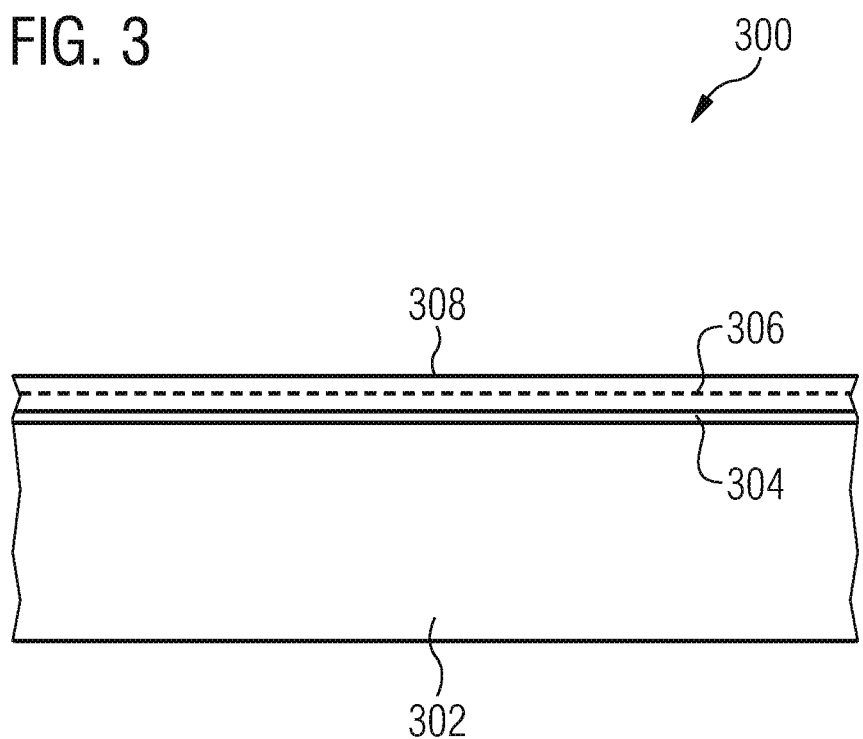
FIG. 3 is a schematic cross-section illustrating a semiconductor device.

Various examples will now be described more fully with reference to the accompanying drawings in which some examples are illustrated. In the figures, the thicknesses of lines, layers and/or regions may be exaggerated for clarity.

Accordingly, while further examples are capable of various modifications and alternative forms, some particular examples thereof are shown in the figures and will subsequently be described in detail. However, this detailed description does not limit further examples to the particular forms described. Further examples may cover all modifications, equivalents, and alternatives falling within the scope of the disclosure. Like numbers refer to like or similar elements throughout the description of the figures, which may be implemented identically or in modified form when compared to one another while providing for the same or a similar functionality.

It will be understood that when an element is referred to as being "connected" or "coupled" to another element, the elements may be directly connected or coupled or via one or more intervening elements. If two elements A and B are combined using an "or", this is to be understood to disclose all possible combinations, i.e. only A, only B as well as A and B. An alternative wording for the same combinations is "at least one of A and B". The same applies for combinations of more than 2 Elements.

The terminology used herein for the purpose of describing particular examples is not intended to be limiting for further examples. Whenever a singular form such as "a," "an" and "the" is used and using only a single element is neither explicitly or implicitly defined as being mandatory, further examples may also use plural elements to implement the same functionality. Likewise, when a functionality is subsequently described as being implemented using multiple elements, further examples may implement the same functionality using a single element or processing entity. It will be further understood that the terms "comprises," "comprising," "includes" and/or "including," when used, specify the presence of the stated features, integers, steps, operations, processes, acts, elements and/or components, but do not preclude the presence or addition of one or more other features, integers, steps, operations, processes, acts, elements, components and/or any group thereof.

Unless otherwise defined, all terms (including technical and scientific terms) are used herein in their ordinary meaning of the art to which the examples belong.

FIG. 1 shows a flow chart of a method 100 for forming a semiconductor device. The method comprises forming 110 a silicone layer on a semiconductor die. The method 100 further comprises plasma treating 120 a silicone surface of the silicone layer. The method 100 further comprises depositing 130 a surfactant on the plasma-treated silicone surface of the silicone layer to obtain a silicone surface at least partly covered by surfactant. The method 100 further comprises forming 140 a mold on the silicone surface at least partly covered by surfactant. The surfactant comprises surfactant molecules comprising an inorganic skeleton terminated by organic compounds.

The plasma treatment 120 of the silicone layer and subsequent depositing 130 of the surfactant may enable a more durable change in the surface adhesion forces of the silicone layer, which may enable a stronger adhesion of the mold to the silicone layer. This may enable a usage of silicone to implement a passivation of the semiconductor device, which may enable an improved protection of the semiconductor device from external influences and/or an increased life cycle and/or durability.

For example, the forming 110 of the silicone layer may comprise spin coating of the silicone on the semiconductor die or (screen-) printing of the silicone on the semiconductor die. For example, the silicone layer may be formed on at least 70% (or at least 75%, at least 80%, at least 85%, at least 90%) of a (lateral) surface of the semiconductor die (e.g. front side surface). An increased coverage of the semiconductor die by the silicone layer may improve a protection of the semiconductor die against external influences, e.g. humidity. For example, the forming 110 of the silicone layer may include forming at least one (lateral) contact pad opening within the silicone layer. For example, the silicone layer may comprise a silicone rubber or silicone elastomer, e.g. based on poly (dimethylsiloxane) (PDMS). For example, the silicone layer may comprise a polysiloxane. For example, the silicone layer may comprise a thickness (e.g. vertical dimension) of more than 2 µm (or more than 3 µm, more than 5 µm, more than 8 µm, more than 10 µm) and less than 30 µm (or less than 25 µm, less than 20 µm, less than 15 µm).

For example, the plasma treating 120 may comprise treating the silicone surface of the silicone layer with at least one of an argon/oxygen plasma (e.g. comprising at least 20% argon and at least 20% oxygen, chemical symbols $Ar/O_2$), an argon plasma (e.g. comprising at least 50% argon, chemical symbol Ar), an oxygen plasma (e.g. comprising at least 50% oxygen, chemical symbol $O_2$), a hydrogen plasma (e.g. comprising at least 50% hydrogen, chemical symbol $H_2$) and a helium plasma (e.g. comprising at least 50% helium, chemical symbol He), e.g. or a combination of two of more plasmas. For example, an argon or argon/oxygen plasma treatment may result in increased adhesion forces in comparison to the improvement obtained by using other plasmas. For example, the plasma treatment may be performed for more than 15 seconds (or more than 30 seconds, more than 45 seconds, more than 60 seconds) and less than 240 seconds (or less than 180 seconds, less than 150 seconds, less than 120 seconds, less than 90 seconds). For example, the plasma treating 120 may comprise a sputtering of a part of the silicone layer to obtain the plasma-treated surface of the silicone layer, e.g. when treating the surface of the silicone layer with an argon/oxygen plasma or with an argon plasma. The sputtering may further increase the adhesion forces.

For example, the silicone surface of the silicone layer being plasma treated may be a surface of the silicone layer facing away from the semiconductor die. The silicone layer may comprise a (first) surface facing towards the semiconductor die and a (second/further) surface facing away from the semiconductor die and towards the mold.

For example, the surfactant may correspond to a surface-active agent. For example, the surfactant may comprise a plurality of surfactant molecules. The surfactant molecules comprise an inorganic (anorganic) skeleton terminated by organic compounds. For example, the inorganic skeleton may comprise one or more mutually connected inorganic compounds or atoms. For example, the inorganic skeleton may comprise a single (e.g. silicon, chem. symbol Si) atom or two or more mutually connected atoms or compounds. For example, the inorganic skeleton may comprise at least one silicon atom or may be a silica skeleton. For example, the inorganic skeleton may further comprise one or more oxygen atoms providing a connection to at least a subset of the organic compounds of the surfactant molecules. Methyl compounds (chem. structure —$CH_3$, comprising carbon (C) and hydrogen (H)) or aldehyde compounds (chem. structure —CHO, carbon, hydrogen and oxygen with a double bond between the carbon and the oxygen) are example organic compounds of the surfactant. For example, the surfactant may form a covalent bond with the silicone surface. For example, the surfactant may form a covalent bond with (between) the silicone layer and/or the mold. The creation of covalent bonds may increase an adhesion of the mold to the silicone layer. For example, the surfactant may comprise surfactant molecules comprising a hydrophilic portion and a hydrophobic portion, e.g. by having a different upper and lower structure. For example, a first portion of the surfactant may be polar and a second portion of the surfactant may be nonpolar. For example, the surface of the plasma-treated silicone layer (the silicone surface) covered with surfactant may exhibit positive polar forces, negative polar forces and dispersion forces (e.g. towards the mold). For example, the surfactant molecules may comprise charged groups exhibiting Coulomb forces to the silicon layer and groups exhibiting van der Waals forces towards the mold.

For example, the depositing 130 of the surfactant may cover at least 60% (or at least 70%, at least 80%, at least 90%) of the silicone surface with surfactant. An increased portion of the silicone surface covered by surfactant may increase an overall adhesion force of the mold to the silicone layer. For example, the surfactant may be deposited 130 by spilling the surfactant (e.g. in diluted form) onto the silicone layer. For example, the surfactant may be spun onto the silicone layer. Alternatively, the silicone layer may be dipped into a container comprising the surfactant to deposit the surfactant. For example, the depositing 130 of the surfactant may comprise forming a surfactant monolayer on at least a portion (e.g. at least 50% (or at least 60%, at least 70%, at least 80%) of the) silicone surface. The surfactant monolayer may enable a (more) uniform adhesion of the mold to the portion of the silicone layer covered by surfactant. For example, the surfactant may be deposited by depositing a dilution of at least the surfactant with acetone or in an alcohol solution, which may enable the forming of the surfactant monolayer.

For example, the mold or mold structure may be formed 140 directly on the plasma-treated silicone layer at least partly covered by surfactant. For example, the mold may be in contact with the surfactant (e.g. in a part of the silicone surface covered with surfactant) and/or with the silicone surface (e.g. in a part of the silicone surface of the silicone layer not covered with surfactant). For example, the mold may be located adjacent to the surface of the silicone layer (silicone surface), e.g. at least partially separated (or bonded) by the surfactant at least partly covering the silicone surface. For example, the forming 140 of the mold may comprise molding or screen-printing of the mold on the silicone surface. The mold may be based on or comprise an epoxy resin, for example. For example, the mold may encase or enclose the semiconductor die. For example, the mold may form an outer surface of a package of the semiconductor die. For example, the plasma-treated silicone surface of the silicone layer may be completely covered by mold after forming 140 the mold.

For example, the silicone layer may comprise photopatternable silicone. For example, the forming 110 of the silicone layer may comprise structuring photopatternable silicone, e.g. based on photolithography, e.g. to obtain at least one contact pad opening within the silicone layer. For example, the forming 110 of the silicone layer may comprise depositing the photopatternable silicone on the semiconductor die before structuring the photopatternable silicone. The structuring of the silicone layer may enable a protection of the semiconductor die while allowing for contact pad openings. For example, the method may further comprise bonding of the semiconductor die after the structuring of the silicone layer, e.g. by attaching bonding balls (of a flip-chip bonding) or bond wires (for bonding to a lead frame) to (contact pads of) the semiconductor die.

For example, the vertical direction and a vertical dimension or thicknesses of layers may be measured orthogonal to a front side surface of the semiconductor die and a lateral direction and lateral dimensions may be measured in parallel to the front side surface of the semiconductor die.

FIG. 2 shows a flow chart of a method 200 for forming a semiconductor device. The method 200 comprises forming 210 a silicone layer on a semiconductor die (of the semiconductor device). The method 200 further comprises plasma treating 220 a silicone surface of the silicone layer with an argon or argon/oxygen plasma. The method further comprises forming 240 a mold above the plasma-treated silicone surface.

The plasma treatment of the silicone layer may lead to a (temporary) increase in the surface adhesion forces of the silicone layer, which may enable a stronger adhesion of the mold to the silicone layer. This may enable a usage of silicone to implement a passivation of the semiconductor device, which may enable an improved protection of the semiconductor device from external influences and/or an increased life cycle and/or durability. For example, the forming 240 of the mold above the silicone surface may be performed less than 12 hours (or less than 10 hours, less than 8 hours, less than 6 hours, less than 4 hours, less than 2 hours) after the plasma treating 220 of the silicone surface of the silicone layer. The forming of the mold within hours after the plasma treatment may enable an improved adhesion of the mold to the silicone layer (e.g. to preempt a more advanced hydrophobic recovery of the silicone layer). For example, the forming 240 of the mold on the silicone may be performed in the back-end of line of a fabrication of the semiconductor device. For example, the plasma-treating of the silicone surface may be performed directly before the forming of the mold. For example, the mold may be formed directly on (e.g. adjacent to and in contact with) the plasma-treated silicone surface (e.g. without surfactant or any other material in between).

Alternatively, the mold may be formed directly on (e.g. adjacent to and in contact with) a plasma-treated silicone surface at least partly covered with surfactant. For example, the method 200 may further comprise depositing 230 a surfactant on the plasma-treated silicone surface of the silicone layer to obtain a silicone surface at least partly covered by surfactant. The mold may be formed on the silicone surface at least partly covered by surfactant. For example, the depositing of the surfactant may enable a more durable change in the surface adhesion forces of the silicone layer. For example, the surfactant may comprise surfactant molecules comprising an inorganic skeleton terminated by organic compounds. Such surfactants may enable a more durable change in the surface adhesion forces of the silicone layer. Alternatively (or additionally), the surfactant may comprise amphiphilic organic compounds.

For example, the method 200 may be implemented similar to a method introduced in connection with FIG. 1. For example, the forming 210 of the silicone layer may be implemented similar to a forming 110 of a silicone layer as introduced in connection with FIG. 1. For example, the plasma treating 220 of the silicone surface of the silicone layer may be implemented similar to a plasma treating 120 of a silicone surface of a silicone layer as introduced in connection with FIG. 1. For example, the depositing 230 of surfactant may be implemented similar with a depositing 130 of a surfactant as introduced in connection with FIG. 1. For example, the forming 240 of the mold may be implemented similar to a forming 140 of a mold as introduced in connection with FIG. 1.

More details and aspects of the method 200 are mentioned in connection with the proposed concept or one or more examples described above (e.g. FIG. 1). The method 200 may comprise one or more additional optional features corresponding to one or more aspects of the proposed concept or one or more examples described above or below.

FIG. 3 shows a schematic cross-section of a semiconductor device 300. The semiconductor device 300 comprises a semiconductor die 302. The semiconductor device further comprises a silicone layer 304 located on the semiconductor die. A silicone surface of the silicone layer is at least partially covered by surfactant 306. The semiconductor device further comprises a mold 308 located adjacent to the silicone surface at least partially covered by surfactant 306.

The surfactant, which may be applied to the silicone layer after a plasma treatment, may enable a stronger adhesion of the mold to the silicone layer. This may enable a usage of silicone to implement a passivation of the semiconductor device, which may enable an improved protection of the semiconductor device from external influences.

The semiconductor die 302 may comprise a semiconductor substrate, e.g. a silicon substrate. Alternatively, the semiconductor die may comprise a wide band gap semiconductor substrate having a band gap larger than the band gap of silicon (1.1 eV). For example, the semiconductor substrate may be a silicon carbide (SiC)-based semiconductor substrate, or gallium arsenide (GaAs)-based semiconductor substrate, or a gallium nitride (GaN)-based semiconductor substrate. Further, the semiconductor device may comprise one or more wiring layers to connect one or more electrical element structures (e.g. a transistor structure or diode structure) implemented at the semiconductor substrate of the semiconductor die.

The semiconductor die may comprise one or more transistor structures (e.g. an Insulated-Gate Bipolar Transistor (IGBT) or a Field Effect Transistor (FET)), for example. The transistor structure may be a vertical transistor arrangement, for example. The transistor structure may be a vertical MOSFET (Metal-Oxide-Semiconductor-FET) or IGBT. For example, the vertical transistor arrangement may be an electrical structure enabling a vertical current flow. For example, the transistor structure of the semiconductor die may control and/or conduct and/or block a current flow between the front side of the semiconductor device and a backside of the semiconductor die.

For example, the semiconductor device 300 may be a central processing unit CPU, a memory device, a microcontroller, a sensor device or a power semiconductor device. A power semiconductor device or an electrical element structures (e.g. a transistor structure or diode structure) may comprise a breakdown voltage or blocking voltage of more than 10V (e.g. a breakdown voltage of 10 V, 20 V or 50V), more than 100 V (e.g. a breakdown voltage of 200 V, 300 V, 400V or 500V) or more than 500 V (e.g. a breakdown voltage of 600 V, 700 V, 800V or 1000V) or more than 1000 V (e.g. a breakdown voltage of 1200 V, 1500 V, 1700V, 2000V, 3300V or 6500V), for example.

More details and aspects of the semiconductor device 300 are mentioned in connection with the proposed concept or one or more examples described above (e.g. FIG. 1 or 2). The semiconductor device 300 may comprise one or more additional optional features corresponding to one or more aspects of the proposed concept or one or more examples described above or below.

At least some embodiments may provide an improved concept for a generation and stabilization of hydrophilic properties and surface adhesion forces of silicone by a combined surface treatment.

An adhesion of a mold compound e.g. Epoxy to a silicone-comprising surface may in some systems be insufficient. This adhesion may be vital to implement silicone as chip end passivation layer in discrete components. Silicone may be a good material for passivation to prevent corrosion and other time deterioration effects.

For example, the lack of surface adhesion forces may be addressed by temporary improvement of the adhesion by plasma treatment. The mold process may be done directly, e.g. before hydrophobic recovery or after plasma modification additional treatment with a surfactant to stabilize and improve the surface adhesion forces (create stable chemical conditions).

For example, adhesion forces may be temporarily improved with plasma (treatment). For example, ArO2 (argon oxygen) plasma, Ar (argon) plasma, O2 (oxygen) plasma and forming gas, may be used with a process times of 30 sec to 2 min. Other plasmas may be applied, e.g. pure H2 (hydrogen) plasma, He (helium) Plasma and mixtures of before-mentioned plasma compounds.

Figure 4:
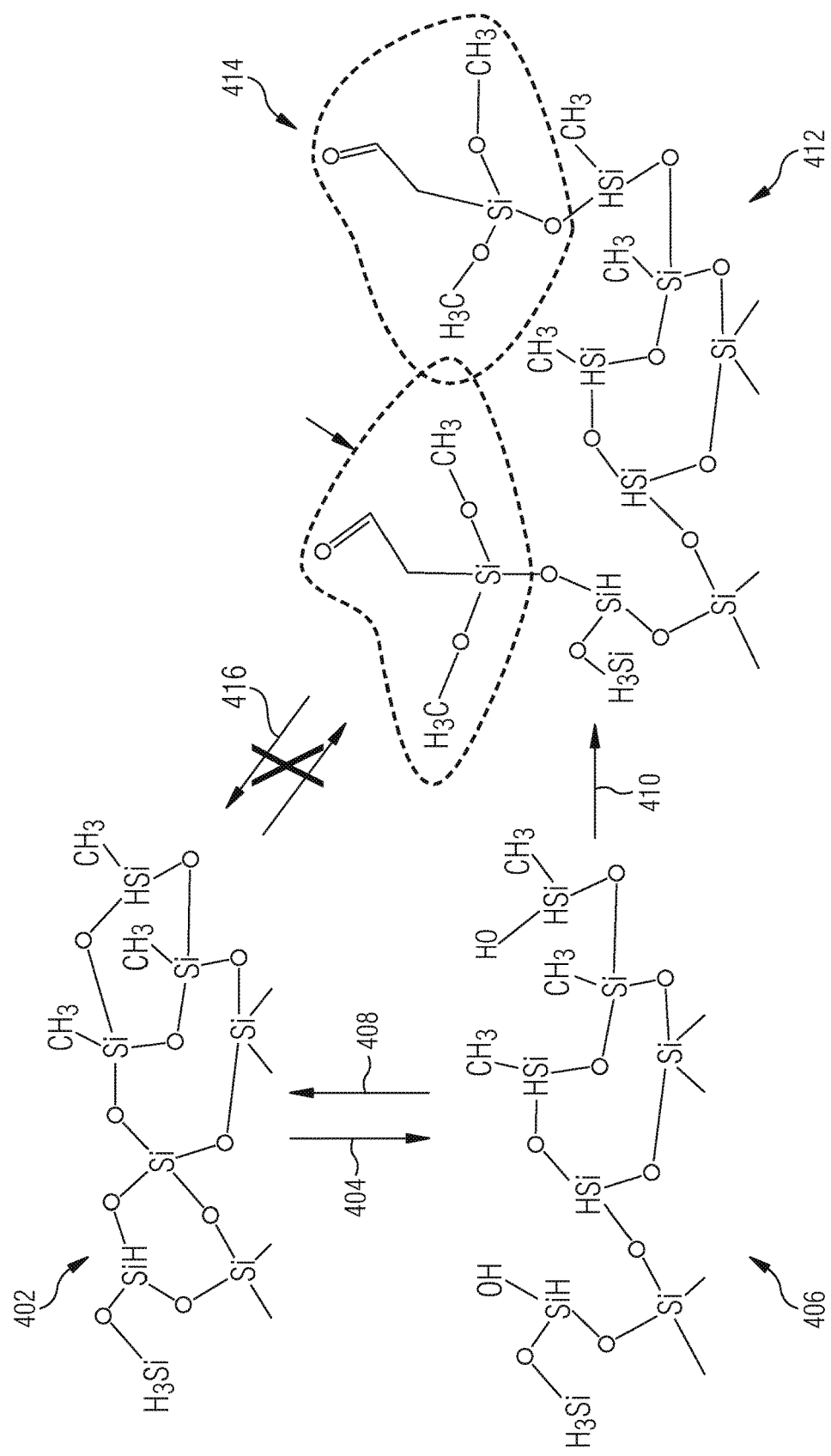
FIG. 4 is structural formulae illustrating a surface modification of a silicone layer caused by plasma treatment and deposition of a surfactant.

By the plasma (treatment), many surface termination groups may change from van der Waals type methyl groups to polar OH, O (O being the chemical symbol for oxygen and H being the chemical symbol for hydrogen), e.g. hydroxyl, groups. FIG. 4 may show a creation of O, OH groups by plasma. These polar OH, O groups may act as starting point of stronger hydrogen-bridge bonding. For example, strong covalent bonding opportunities may be offered, which may increase the adhesion properties.

The change to more polar groups may be observed by hydrophilicity measurements. Contact angle measurements may be conducted on silicone without and with plasma treatment. The different kinds of plasma may change the contact angle from >100° to 0°-20° with Ar and ArO2, to 20°-40° with $O_2$ and to 90° with forming gas. Additionally, a hydrophobic recovery may be shown, with a significant hydrophobic recovery between the plasma treatment and the first day after the plasma treatment (e.g. to ~30° for Ar or $ArO_2$-plasma-treated silicone and 40°-50° for $O_2$-plasma-treated silicone), relative stagnation between the first day and the $4^{th}$ day, and a near-complete hydrophobic recovery by the 7th day (e.g. to ~80° for Ar, $ArO_2$ and $O_2$-plasma-treated silicone). The contact angle may increase step by step from 0-20° to 80°. The process of O- and OH-groups generation may be reversible in the silicone case. The (silicone) surface may be changing back, day by day to the less polar state, reducing the surface adhesion forces. The mold process may be done within the first hours after plasma treatment. Such plasma treatment may be implemented in the assembly line itself, (e.g. directly) before the mold process.

For example, after plasma modification, the surface adhesion forces may be improved and stabilized by additional treatment with a surfactant. After plasma treatment, a diluted surfactant may be spilled out on the silicone. Spreading and drying of the surfactant may be done. After 6 days, the surface adhesion forces may be measured with three different liquids: water, diiodomethane and ethylene glycol. These three liquids may be used with the van Oss method, to generally evaluate the surface adhesion forces. All three different liquid drops may spread within several seconds to the flat state. This may indicate that the general surface adhesion forces may be high and stable. So a stable chemical condition of the surface with high adhesion to a mold compound may be created by applying a surfactant, e.g. AP100 by EPO-TEK, after plasma treatment.

FIG. 4 shows structural formulae of a surface modification of a silicone layer caused by plasma treatment and deposition of a surfactant. FIG. 4 may show a mechanism of temporary and permanent surface modification according to an embodiment. FIG. 4. shows a silicone molecule 402 before plasma treatment. After argon/oxygen plasma treatment 404 the resulting molecule 406 may exhibit a temporary surface modification through the plasma treatment (oxygen-hydrogen compounds at the surface). Through recombination 408, the silicone molecule may revert back to its original state 402. In case a surfactant is applied 410 after plasma treatment, a permanent surface modification of the resulting molecule 412 may be reached, where the silicone molecule is terminated by the surfactant 414 towards the surface of the molecule. No recombination 416 towards the original state 402 might occur.

For example, the surfactant may comprise aminopropylsilane. Various surfactants may be used, which may provide proper stabilization of the plasma induced surface change. The use of a surfactant may also bear the possibility to introduce reactive chemical end-groups like amines, carbonyls, acids, etc., which may mean that depending on the preferred mold compound a specific end group may be selected to form a strong covalent bond with the silicone.

If only plasma is applied, stable surface adhesion forces might not be reached. The surface may change back over time to hydrophobic, unipolar state. If surfactant is applied directly to the virgin silicone surface, no improvement of surface adhesion may be reached, for example. The diluted surfactant may be spilled over the silicone, but after drying, the surfactant component may collect into a drop and might not distribute over the silicone. The surfactant molecule may be repelled from the surface, homogeneous covering might not be possible.

A combination of a plasma treatment with a following surfactant treatment may be successful to increase and stabilize the surface adhesion forces (e.g. to create stable chemical conditions). For example, the surfactant may form a surfactant monolayer after depositing when applied in highly diluted form (e.g. as highly diluted alcoholic solution).

The aspects and features mentioned and described together with one or more of the previously detailed examples and figures, may as well be combined with one or more of the other examples in order to replace a like feature of the other example or in order to additionally introduce the feature to the other example.

Examples may further be or relate to a computer program having a program code for performing one or more of the above methods, when the computer program is executed on a computer or processor. Steps, operations or processes of various above-described methods may be performed by programmed computers or processors. Examples may also cover program storage devices such as digital data storage media, which are machine, processor or computer readable and encode machine-executable, processor-executable or computer-executable programs of instructions. The instructions perform or cause performing some or all of the acts of the above-described methods. The program storage devices may comprise or be, for instance, digital memories, magnetic storage media such as magnetic disks and magnetic tapes, hard drives, or optically readable digital data storage media. Further examples may also cover computers, processors or control units programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. Furthermore, all examples recited herein are principally intended expressly to be only for pedagogical purposes to aid the reader in understanding the principles of the disclosure and the concepts contributed by the inventor(s) to furthering the art. All statements herein reciting principles, aspects, and examples of the disclosure, as well as specific examples thereof, are intended to encompass equivalents thereof.

A functional block denoted as "means for . . . " performing a certain function may refer to a circuit that is configured to perform a certain function. Hence, a "means for s.th." may be implemented as a "means configured to or suited for s.th.", such as a device, a circuit or a process flow configured to or suited for the respective task.

Functions of various elements shown in the figures, including any functional blocks labeled as "means", "means for providing a sensor signal", "means for generating a transmit signal.", etc., may be implemented in the form of dedicated hardware, such as "a signal provider", "a signal processing unit", "a processor", "a controller", etc. as well as hardware capable of executing software in association with appropriate software. When provided by a processor, the functions may be provided by a single dedicated processor, by a single shared processor, or by a plurality of individual processors, some of which or all of which may be shared. However, the term "processor" or "controller" is by far not limited to hardware exclusively capable of executing software, but may include digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included.

A block diagram may, for instance, illustrate a high level circuit diagram implementing the principles of the disclosure. Similarly, a flow chart, a flow diagram, a process flow, a state transition diagram, a pseudo code, and the like may represent various processes, operations or steps, which may, for instance, be substantially represented in computer readable medium and so executed by a computer or processor, whether or not such computer or processor is explicitly shown. Methods disclosed in the specification or in the claims may be implemented by a device having means for performing each of the respective acts of these methods.

It is to be understood that the disclosure of multiple acts, processes, operations, steps or functions disclosed in the specification or claims may not be construed as to be within the specific order, unless explicitly or implicitly stated otherwise, for instance for technical reasons. Therefore, the disclosure of multiple acts or functions will not limit these to a particular order unless such acts or functions are not interchangeable for technical reasons. Furthermore, in some examples a single act, function, process, operation or step may include or may be broken into multiple sub-acts, -functions, -processes, -operations or -steps, respectively. Such sub acts may be included and part of the disclosure of this single act unless explicitly excluded.

Furthermore, the following claims are hereby incorporated into the detailed description, where each claim may stand on its own as a separate example. While each claim may stand on its own as a separate example, it is to be noted that—although a dependent claim may refer in the claims to a specific combination with one or more other claims—other examples may also include a combination of the dependent claim with the subject matter of each other dependent or independent claim. Such combinations are explicitly proposed herein unless it is stated that a specific combination is not intended. Furthermore, it is intended to include also features of a claim to any other independent claim even if this claim is not directly made dependent to the independent claim.

What is claimed is:

1. A method for forming a semiconductor device, the method comprising:
    forming a silicone layer on a semiconductor die;
    plasma treating a silicone surface of the silicone layer;
    depositing a surfactant on the plasma-treated silicone surface of the silicone layer to obtain a silicone surface at least partly covered by surfactant; and
    forming a mold on the silicone surface at least partly covered by surfactant,
    wherein the surfactant comprises surfactant molecules comprising an inorganic skeleton terminated by organic compounds.

2. The method according to claim 1, wherein plasma treating comprises treating the silicone surface of the silicone layer with at least one of a group consisting of an argon/oxygen plasma, an argon plasma, an oxygen plasma, a hydrogen plasma and a helium plasma.

3. The method according to claim 1, wherein depositing of the surfactant comprises forming a surfactant monolayer on at least a portion of the plasma-treated silicone layer.

4. The method according to claim 1, wherein the surfactant reacts to form a covalent bond between the silicone layer and the mold.

5. The method according to claim 1, wherein depositing of the surfactant covers at least 60% of the silicone surface with surfactant.

6. The method according to claim 1, wherein the surfactant is deposited by depositing a dilution of at least the surfactant with acetone.

7. The method according to claim 1, wherein plasma treating comprises a sputtering of a part of the silicone layer to obtain the plasma-treated silicone surface of the silicone layer.

8. The method according to claim 1, wherein the silicone layer is formed on at least 70% of a surface of the semiconductor die.

9. The method according to claim 1, wherein forming the silicone layer comprises structuring photopatternable silicone.

10. The method according to claim 9, wherein forming the silicone layer comprises depositing the photopatternable silicone on the semiconductor die before structuring the photopatternable silicone.

11. The method according to one of the claim 9, further comprising bonding of the semiconductor die after the structuring of the silicone layer.

12. The method according to claim 1, wherein the plasma-treated silicone surface of the silicone layer is completely covered by mold after forming the mold.

13. A method for forming a semiconductor device, the method comprising
forming a silicone layer on a semiconductor die;
plasma treating a silicone surface of the silicone layer with an argon or argon/oxygen plasma; and
forming a mold above the plasma-treated silicone surface.

14. The method according to claim 13, wherein forming of the mold above the silicone surface is performed less than 12 hours after the plasma treating of the silicone surface of the silicone layer.

15. The method according to claim 13, further comprising depositing a surfactant on the plasma-treated silicone surface of the silicone layer to obtain a silicone surface at least partly covered by surfactant, wherein the mold is formed on the silicone surface at least partly covered by surfactant.

16. The method according to claim 15, wherein the surfactant comprises surfactant molecules comprising an inorganic skeleton terminated by organic compounds.

17. A semiconductor device, comprising:

a semiconductor die;

a silicone layer located on the semiconductor die, wherein a silicone surface of the silicone layer is at least partially covered by surfactant; and a mold located adjacent to the silicone surface at least partially covered by surfactant.

* * * * *